United States Patent [19]

Schwarz et al.

[11] Patent Number: 5,378,682
[45] Date of Patent: Jan. 3, 1995

[54] DENSE SUPERCONDUCTING BODIES WITH PREFERRED ORIENTATION

[75] Inventors: Martin Schwarz; Iris Küllmer, both of Frankfurt am Main; Joachim Bock, Erftstadt-Lechenich, all of Germany

[73] Assignee: Hoechst Aktiengesellschaft, Frankfurt am Main, Germany

[21] Appl. No.: 92,034

[22] Filed: Jul. 15, 1993

Related U.S. Application Data

[63] Continuation of Ser. No. 761,983, filed as PCT/EP90/00470, Mar. 22, 1990, abandoned.

[30] Foreign Application Priority Data

Mar. 25, 1989 [DE] Germany .................. 3909882

[51] Int. Cl.⁶ .................. C01G 29/00; H01B 13/00
[52] U.S. Cl. .................. 505/490; 505/785; 264/65; 501/152; 501/151; 501/123
[58] Field of Search .......... 505/1, 785; 264/65; 501/123, 151, 152

[56] References Cited

U.S. PATENT DOCUMENTS

| | | | |
|---|---|---|---|
| 5,021,399 | 6/1991 | Hsu | 505/1 |
| 5,055,445 | 10/1991 | Belt | 505/1 |
| 5,077,271 | 12/1991 | Hiskes | 505/1 |

FOREIGN PATENT DOCUMENTS

| | | | |
|---|---|---|---|
| 0285107 | 10/1988 | European Pat. Off. | |
| 0295023 | 12/1988 | European Pat. Off. | 505/739 |
| 0298647 | 1/1989 | European Pat. Off. | |
| 0298648 | 1/1989 | European Pat. Off. | |
| 0351037 | 1/1990 | European Pat. Off. | |
| 0224221 | 9/1984 | Japan | 505/739 |
| 0242921 | 10/1988 | Japan | 505/739 |
| 0256518 | 10/1988 | Japan | 505/779 |
| 0172208 | 7/1989 | Japan | 505/780 |
| 1172208 | 7/1989 | Japan | |

OTHER PUBLICATIONS

Jpn 01275492, Katsui, 6 Nov. 1989 (Abstract).
Jpn 63310762, Kamitori, 19 Dec. 1988 (Abstract).
Stavola, "Ramon Scrattering from Single Crystals . . . ", Physical Rev. B, vol. 38171, Sep. 1, 1988, pp. 5110–5113.
Matsuda, "Critical Current Density Bi–Pb–Sr–Cu–Cu–O . . . ", Jpn. Jnl. Appl. Phys., vol. 27(9), Sep. 1988, pp. L1650–L1651.
Asano, "Preparation of Highly Oriented . . . ", Jap. Jnl. Appl. Phys., vol. 27(9), Sep. 1988, pp. L1652–L1654.

Primary Examiner—Mark L. Bell
Assistant Examiner—C. M. Bonner
Attorney, Agent, or Firm—Curtis, Morris & Safford

[57] ABSTRACT

A description is given of a solid oxide-ceramic superconductor containing copper in the crystal lattice which is composed of crystals which are arranged essentially in parallel and intergrown with one another and which also contains, per 100 g of copper in the superconductor, 0.04 to 0.5 mol of $CuF_2$ or KF, and of a sinter process for producing it. The copper-containing superconductor may be made up, for example, of bismuth, strontium, calcium or of bismuth, strontium, calcium, lead and also copper and oxygen.

5 Claims, 2 Drawing Sheets

DENSE SUPERCONDUCTING BODIES WITH PREFERRED ORIENTATION

This application is a continuation of application Ser. No. 07/761,983, filed as PCT/EP90/00470, Mar. 22, 1990, now abandoned.

The present invention relates to dense oxide-ceramic superconducting bodies containing copper and an advantageous regular arrangement of the crystallites, and also to a process for producing them.

The recently discovered high-temperature superconducting compounds based on Y-Ba-Cu-O, Bi-Sr-Ca-Cu-O or Tl-Ba-Ca-Cu-O hold out the prospect of a multiplicity of attractive possible applications in view of their high critical temperatures $T_c$. A disadvantage in this connection is that for applications of a solid body (i.e. not in the form of thin layers) the current-carrying capacity, which is decisive for many applications, has only low values. Apart from impurities at the grain boundaries ("weak links"), the fact that these superconductors have a layer-type crystal structure which results in an anisotropy of important physical properties is regarded especially as the reasons for this. For example, it has been shown in single crystals of $YBa_2Cu_3O_{7-x}$ that superconducting currents flow in only one plane which runs perpendicular to the lattice axis c. An undisturbed current flow can therefore only be observed if the individual crystals are aligned parallel to one another and are closely adjacent. A parallel alignment is favored if the individual (not joined to one another) crystallites have a preferred direction, for example are elongated.

The object was therefore to provide solid superconductors in which the crystalline regions are arranged essentially parallel to one another.

The invention achieves this object. it is based on the discovery that, on sintering powders of oxide-ceramic superconductors containing copper in the crystal lattice, the additives $CuF_2$ and $KF$ favor the formation of specimens with preferred orientation.

Figure 2:
FIGS. 1–4 are micrographs of Example 1.

The file of this patent contains at least one drawing executed in color. Copies of this patent with color drawings(s) will be provided by the Patent and Trademark Office upon request and payment of the necessary fee.

The subject of the invention are solid oxide-ceramic superconductors which contain copper in the crystal lattice and which contain approximately 0.04 to 0.5 mol of copper(II) fluoride or potassium fluoride per 100 g of copper in the superconductor. The additives do not appear to be decisive for the favorable properties of the superconductor since the latter are not impaired when the additive is dissolved out; their presence is, however, necessary to achieve the result that the individual crystalline regions intergrow and are arranged essentially parallel to one another.

Examples of copper-containing oxide-ceramic superconductors according to the invention are compounds of the formula $MBa_2Cu_3O_x$, where M is yttrium or an element of the numbers 61 to 71 and x is a number between 6.5 and 7.2, oxide-ceramic superconductors of the system Bi-Sr-Ca-Cu-O or of the system Bi-Pb-Sr-Ca-Cu-O.

For example, superconductors of the formulae $(Bi,Pb)_2(Sr,Ca)_2CuO_a$ (cf. M. Takano et al., Jap. J. Appl. Phys. 27, 6 (1988), L 1041), $Bi_2(Sr,Ca)_2CuO_b$, $Bi_2(Sr,Ca)_3Cu_2O_c$ and $Bi_2(Sr,Ca)_4Cu_3O_d$ are usable.

Preferred are compounds of the $MBa_2Cu_3O_x$ system, in particular for the case where M=Y. If, on the other hand, a fine $YBa_2Cu_3O_x$ powder is sintered in the absence of additives to form dense bodies, their structure is built up completely irregularly in relation to the size and shape of the grains. In particular, the grains are composed of small irregularly shaped crystalline regions with proportions of amorphous regions.

The proportion of the additives copper fluoride and potassium fluoride is, in particular, 0.042–0.44 mol per 100 g of copper in the superconductor. With these additions, the crystals of the superconductors have, in general, a length/diameter ratio of 3:1–30:1. The density of superconductors according to the invention of the formula $MBa_2Cu_3O_x$ is, in general, 6.0 to 6.33 g/cm$^3$.

The superconductors according to the invention can be produced by a process which comprises mixing a powdered superconductor containing copper in the lattice with 0.04 to 0.5 mol, preferably 0.042 to 0.44 mol, in particular 0.045 to 0.3 mol of copper fluoride or potassium fluoride per 100 g of copper in the superconductor, deforming the mixture under a pressure of at least 1 MPa to produce a molded body and heating the latter for at least one hour at temperatures of 980° to 1200° C., in particular 1000°–1050° C. An alternative production process is based on a mixture, which results in the formation of a superconductor, of the starting components such as, for example, the respective metal oxides, metal carbonates or metal nitrites, to which $CuF_2$ or KF is added and which is reacted in an analogous manner. In this process, a fused phase almost always occurs, at least partially. Probably, said fused phase is responsible for the development of coherent crystalline regions. This heating lasts at least two hours, preferably at least 5 hours. In all cases, it is advantageous if the heating is carried out in an atmosphere which contains free oxygen. It is furthermore advantageous if cooling is carried out, after this step, to a temperature of at least 400° C., in which a liquid phase is no longer present, for example to temperatures of 880° to 900° C., and the mixture is held at this temperature in the presence of an oxygen-containing atmosphere for at least one hour, preferably, however, for at least 5 hours. It is particularly preferable if, in both stages, the duration of the heating is in the region of 10 to 20 hours, preferably 15 hours. In some cases, the additive can be used even during the production of the starting product (oxide-ceramic superconductor with copper in the crystal lattice).

The current-carrying capacity of the products which are obtained by this process is markedly higher than in products which have been pressed and sintered without additives.

The invention is explained in greater detail by the examples.

EXAMPLE 1

$YBa_2Cu_3O_x$ powder is mixed with 5% by weight of finely powdered $CuF_2$ and pressed under a pressure of approximately 300 MPa (3 kbar) to produce molded bodies. The molded bodies are sintered as follows:

Heating in 10 h to 1000° C.
20 h of annealing at 1000° C.
cooling in 2 h to 900° C.
10 h of annealing at 900° C.
Cooling in 10 h to 20° C.

Figure 1:
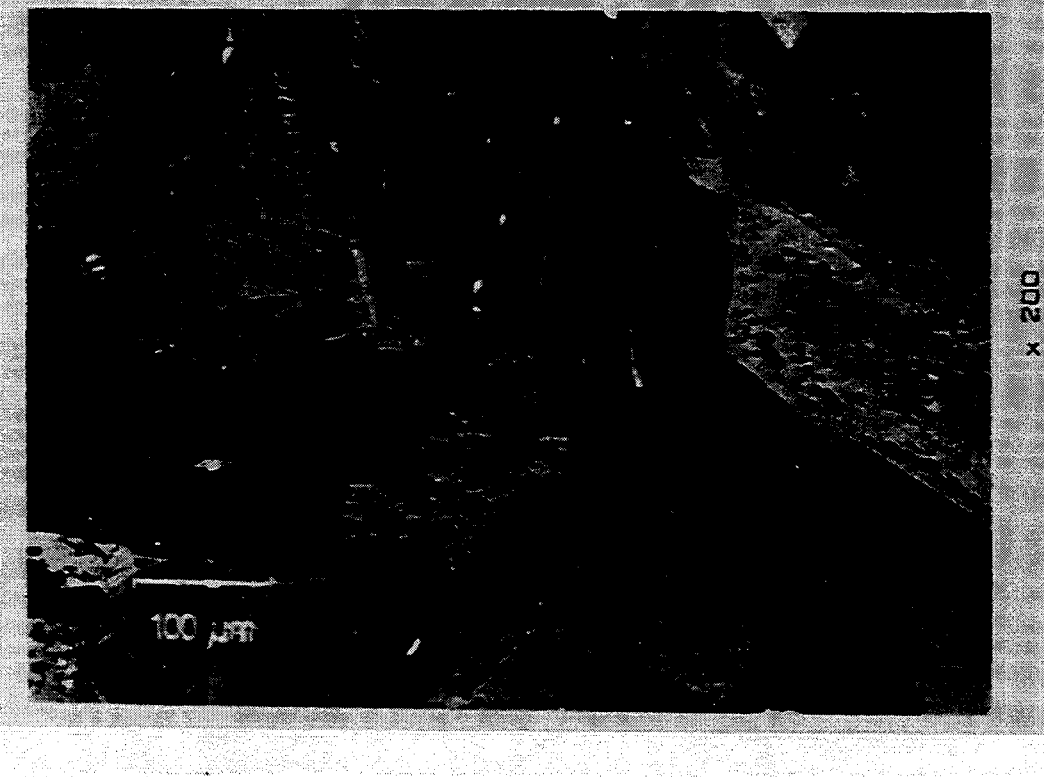
Figure 4:
Figure 3:
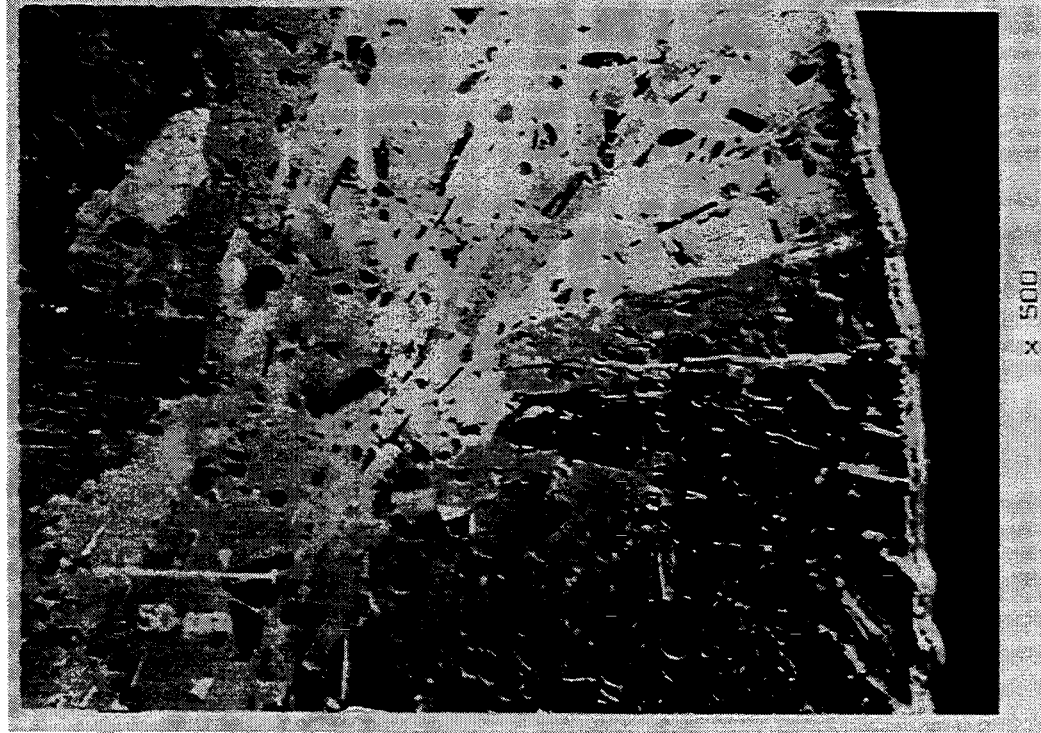

Micrographs of the specimens produced exhibit an ordered structure with preferred orientation having singlecrystal domains in the order of magnitude of approximately 100–1000 μm which are lamellarly arranged. Large crystalline regions of ordered structure and twin domains which run in parallel even across grain boundaries, are visible in FIGS. 1 to 4.

EXAMPLE 2

If Example 1 is repeated with a powder of identical composition but with a different oxygen content or different grain size distribution, dense superconducting bodies with preferred orientation and comparable properties are obtained.

EXAMPLE 3

(Production of a starting product)

2 mol of $Bi_2O_3$, 4 mol of $SrCO_3$, 4 mol of CaO and 8 mol of CuO are comminuted in an agate mortar, thoroughly mixed and transferred to an $Al_2O_3$ crucible. The specimen is heated rapidly to 800°–820° C. in air, held there for 20 hours and rapidly cooled to room temperature. The roasted powder is comminuted and thermally and mechanically treated two more times as described.

The black powder is then pressed under a pressure of 300 MPa (3 kbar) to produce tablets, the latter are laid on MgO slabs and treated in air as described below:
Heating in 3 hours to 870° C.
80 hours of annealing at 870° C.
passing through the following temperature cycle three times:
Cooling in 3 hours to 600° C.
3 hours of annealing at 600° C.
Heating in 3 hours to 870° C.
3 hours of annealing at 870° C.
then:
Cooling in 3 hours to 600° C.
3 hours of annealing at 600° C.
Cooling in 3 hours to RT
Conductivity: $T_c(R=0)=98$ K
SQUID measurement: 35% superconducting proportion at 4 K measured at 100 gauss A mixture is obtained of $Bi_2(Sr,Ca)_2CuO_b$, $Bi_2(Sr,Ca)_3Cu_2O_c$ and $Bi_2(Sr,Ca)_4Cu_3O_d$.

We claim:

1. A process for producing a solid oxide-ceramic superconductor which contains copper in the crystal lattice and is essentially composed of elongated crystals which are arranged in parallel and intergrown with one another, which process comprises mixing a powdered superconductor which contains copper in the lattice with 0.04 to 0.5 mol of copper fluoride per 100 g of copper in the superconductor, forming the mixture under a pressure of at least 1 MPa to produce a molded body and heating the molded body for at least 5 hours at a temperature from 1000° to 1050° C.

2. The process as claimed in claim 1, wherein the heating is carried out in an atmosphere which contains free oxygen.

3. The process as claimed in claim 1 wherein 0.042 to 0.44 mol of copper fluoride per 100 g of copper in the superconductor is mixed with the powdered superconductor.

4. The process as claimed in claim 1, wherein the oxide-ceramic superconductor is made up of the elements bismuth, strontium, calcium, copper and oxygen.

5. The process as claimed in claim 1, wherein the oxide-ceramic superconductor has a composition of the formula $MBa_2Cu_3O_x$, where M is yttrium or an element of the numbers 61 to 71 and x is a number between 6.5 and 7.2.

* * * * *